(12) United States Patent
Tomisawa et al.

(10) Patent No.: US 10,742,108 B2
(45) Date of Patent: Aug. 11, 2020

(54) GATE DRIVER AND POWER MODULE

(71) Applicant: Mitsubishi Electric Corporation, Chiyoda-ku (JP)

(72) Inventors: Jun Tomisawa, Chiyoda-ku (JP); Akinori Nishizawa, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/499,506

(22) PCT Filed: Jan. 19, 2018

(86) PCT No.: PCT/JP2018/001589
§ 371 (c)(1),
(2) Date: Sep. 30, 2019

(87) PCT Pub. No.: WO2018/216261
PCT Pub. Date: Nov. 29, 2018

(65) Prior Publication Data
US 2020/0076292 A1  Mar. 5, 2020

(30) Foreign Application Priority Data

May 22, 2017  (JP) ................................ 2017-101009

(51) Int. Cl.
*H02M 1/00* (2006.01)
*H02M 1/08* (2006.01)
(Continued)

(52) U.S. Cl.
CPC ........ *H02M 1/08* (2013.01); *H03K 17/04206* (2013.01); *H03K 17/165* (2013.01);
(Continued)

(58) Field of Classification Search
CPC . H02M 1/08; H03K 17/04206; H03K 17/165; H03K 17/168; H03K 17/284
See application file for complete search history.

(56) References Cited

U.S. PATENT DOCUMENTS

2005/0057275 A1* 3/2005 Ngyuen ............. H03K 19/0005
326/30
2017/0104479 A1   4/2017 Kanamori et al.

FOREIGN PATENT DOCUMENTS

JP          10-70878 A      3/1998
JP          2001-314075 A   11/2001
(Continued)

OTHER PUBLICATIONS

International Search Report dated Apr. 10, 2018 in PCT/JP2018/001589 filed Jan. 19, 2018.

*Primary Examiner* — Adolf D Berhane
*Assistant Examiner* — Afework S Demisse
(74) *Attorney, Agent, or Firm* — Xsensus LLP

(57) ABSTRACT

A programmable decoder (201) includes a counter (204A) whose count value increases for each clock; an address decoder (205A) for converting the count value into an address; a storage (251A) storing a table defining data according to the address converted from the count value; and a latch unit (207) for latching the data according to the address output from the storage (251A). A variable driver (202) includes a plurality of MOS transistors (208), (209), (210). The latch unit (207A) has outputs connected to control electrodes of a plurality of MOS transistors (208), (209), (210). The table defines a plurality of data items in the table so that the driving force of the variable driver (202) increases with an increase of the count value. A counter (20A) updates the count value while the arm control signal is being activated.

19 Claims, 10 Drawing Sheets

(51) Int. Cl.
 *H03K 17/042* (2006.01)
 *H03K 17/16* (2006.01)
 *H03K 17/284* (2006.01)
 *H03K 17/687* (2006.01)

(52) U.S. Cl.
 CPC ......... *H03K 17/168* (2013.01); *H03K 17/284* (2013.01); *H03K 17/687* (2013.01)

(56) References Cited

FOREIGN PATENT DOCUMENTS

| | | | |
|---|---|---|---|
| JP | 2006-325256 | A | 11/2006 |
| JP | 2015-195699 | A | 11/2015 |

* cited by examiner

| CA | ADD_A |
|---|---|
| 000b | 000b+OFFSET |
| 001b | 001b+OFFSET |
| 010b | 010b+OFFSET |
| 011b | 011b+OFFSET |
| 100b | 100b+OFFSET |
| 101b | 101b+OFFSET |
| 110b | 110b+OFFSET |
| 111b | 111b+OFFSET |

| ADD_A | A(xyz)b |
|---|---|
| 000b+OFFSET | 111b |
| 001b+OFFSET | 110b |
| 010b+OFFSET | 110b |
| 011b+OFFSET | 101b |
| 100b+OFFSET | 101b |
| 101b+OFFSET | 100b |
| 110b+OFFSET | 011b |
| 111b+OFFSET | 000b |

| ADD_A | A(xyz)b |
|---|---|
| 0000b+OFFSET | 111b |
| 0001b+OFFSET | 110b |
| 0010b+OFFSET | 110b |
| 0011b+OFFSET | 101b |
| 0100b+OFFSET | 101b |
| 0101b+OFFSET | 100b |
| 0110b+OFFSET | 011b |
| 0111b+OFFSET | 000b |

| ADD_A | A(xyz)b |
|---|---|
| 0000b+OFFSET | 111b |
| 0001b+OFFSET | 110b |
| 0010b+OFFSET | 101b |
| 0011b+OFFSET | 011b |
| 0100b+OFFSET | 000b |
| 0101b+OFFSET | 000b |
| 0110b+OFFSET | 000b |
| 0111b+OFFSET | 000b |

FIG.13

| ADD_A | A(xyz)b |
|---|---|
| 0000b+OFFSET | 111b |
| 0001b+OFFSET | 110b |
| 0010b+OFFSET | 110b |
| 0011b+OFFSET | 101b |
| 0100b+OFFSET | 101b |
| 0101b+OFFSET | 100b |
| 0110b+OFFSET | 011b |
| 0111b+OFFSET | 000b |

FIG.14

| ADD_B | C(xyz)b |
|---|---|
| 0000b+OFFSET | 000b |
| 0001b+OFFSET | 001b |
| 0010b+OFFSET | 001b |
| 0011b+OFFSET | 010b |
| 0100b+OFFSET | 010b |
| 0101b+OFFSET | 011b |
| 0110b+OFFSET | 100b |
| 0111b+OFFSET | 111b |

FIG.15

| ADD_A | B(xyz)b |
|---|---|
| 0000b+OFFSET | 111b |
| 0001b+OFFSET | 100b |
| 0010b+OFFSET | 110b |
| 0011b+OFFSET | 100b |
| 0100b+OFFSET | 100b |
| 0101b+OFFSET | 100b |
| 0110b+OFFSET | 011b |
| 0111b+OFFSET | 000b |

| ADD_B | D(xyz)b |
|---|---|
| 0000b+OFFSET | 000b |
| 0001b+OFFSET | 010b |
| 0010b+OFFSET | 100b |
| 0011b+OFFSET | 100b |
| 0100b+OFFSET | 111b |
| 0101b+OFFSET | 111b |
| 0110b+OFFSET | 111b |
| 0111b+OFFSET | 111b |

GATE DRIVER AND POWER MODULE

TECHNICAL FIELD

The present invention relates to a gate driver and a power module.

BACKGROUND ART

Apparatus are known which slow the switching of an insulated gate bipolar transistor (IGBT) to reduce noise which is generated in the IGBT.

For example, PTL 1 discloses a gate drive circuit capable of externally adjusting the switching characteristics of a voltage-driven semiconductor device included in a power conversion device. The gate drive circuit includes an isolation circuit, a command selection circuit, multiple transistors, multiple on-gate resistors, multiple off-gate resistors, and a gate power supply. A selection signal and a command signal, which are externally commanded, are input to a command selection circuit via the isolation circuit, any one of the multiple on-gate resistances and any one of the multiple off-gate resistances are selected, and a transistor corresponding to the selected on-gate resistance and a transistor corresponding to off-gate resistances are alternately switched on and off, based on the command signal.

CITATION LIST

Patent Literature

PTL 1: Japanese Patent Laying-Open No. H10-70878

SUMMARY OF INVENTION

Technical Problem

In PTL 1, a user of the power conversion device, such as an inverter, is allowed to select characteristics (e.g., high efficiency type or low noise type, etc.) of the inverter to operate with. Thus, one inverter that supports a wide range of operation specifications can be provided.

However, the device disclosed in PTL 1 is unable to transiently, programmanly change the gate current.

Therefore, an object of the present invention is to provide a gate driver and a power module which can transiently, programmanly change the gate current.

Solution to Problem

In order to solve the above problem, the present invention is a gate driver for driving an arm circuit which includes a power device. The gate driver includes a programmable decoder, and a variable driver for driving the arm circuit. The programmable decoder includes a counter whose count value increases for each clock, an address decoder for converting the count value into an address, a storage storing a table which defines data according to the address converted from the count value, and a latch unit for latching the data according to the address output from the storage. The variable driver includes a plurality of MOS transistors. The latch unit has outputs connected to control electrodes of a plurality of MOS transistors, the plurality of MOS transistors have first electrodes commonly connected to a control electrode of the power device, and the plurality of MOS transistors have second electrodes commonly connected to a power source. The data comprises a plurality of data items, the plurality of data items being defined in the table so that the driving force of the variable driver increases with an increase of the count value. The counter updates the count value while the arm control signal is being activated.

Advantageous Effects of Invention

According to the present invention, the driving force of the variable driver is defined by the table, thereby allowing transiently, programmanly change the gate current.

BRIEF DESCRIPTION OF DRAWINGS

FIG. 13 is a diagram representing an example of a table A1 in a table RWM 606A.

FIG. 14 is a diagram representing an example of a table B1 in a table RWM 606C.

FIG. 15 is a diagram representing an example of a table A2 in a table RWM 606B.

DESCRIPTION OF EMBODIMENTS

Hereinafter, embodiments according to the present invention will be described, with reference to the accompanying drawings.

Embodiment 1

Figure 1:
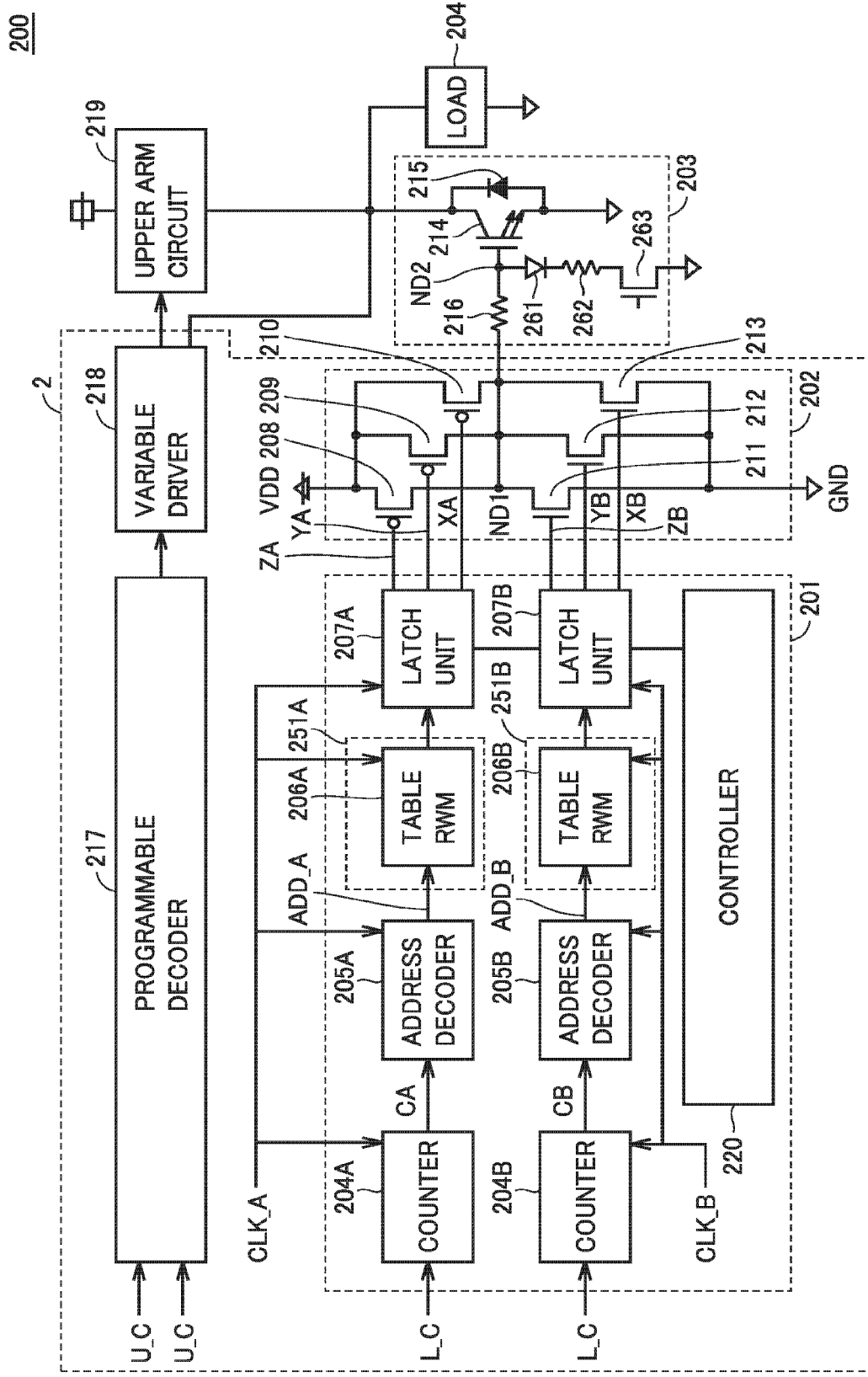
FIG. 1 is a diagram representing a configuration of a power module 200 according to Embodiment 1.

FIG. 1 is a diagram representing a configuration of a power module 200 according to Embodiment 1.

Power module 200 includes a gate driver 2, an upper arm circuit 219, and a lower arm circuit 203.

Gate driver 2 includes, for upper arm circuit 219, a programmable decoder 217, and a variable driver 218 for driving upper arm circuit 219. Gate driver 2 includes, for lower arm circuit 203, a programmable decoder 201, and a variable driver 202 for driving lower arm circuit 203.

FIG. 1 shows specific configurations of programmable decoder 201, variable driver 202, and lower arm circuit 203. Specific configurations of programmable decoder 217, variable driver 218, and upper arm circuit 219 are the same as the specific configurations of programmable decoder 201, variable driver 202, and lower arm circuit 203, respectively, and thus the descriptions thereof will be omitted.

Programmable decoder 201 includes counters 204A, 204B, address decoders 205A, 205B, table read write memories (RWM) 206A, 206B, latch units 207A, 207B, and a controller 220.

Counter 204A, address decoder 205A, table RWM 206A, and latch unit 207A operate according to a clock CLK_A.

Counter 204B, address decoder 205B, table RWM 206B, and latch unit 207B operate according to a clock CLK_B.

CLK_A and CLK_B are non-overlapping clocks which do not overlap with each other.

Counter 204A increments a count value CA by 1 for each clock CLK_A while a lower-arm control signal L_C is being asserted to a high level. As lower-arm control signal L_C is negated to a low level, counter 204A stops updating the count value CA and clears count value CA to zero. Counter 204B increments a count value CB by 1 for each clock CLK_B while lower-arm control signal L_C is being asserted to a high level. As lower-arm control signal L_C is negated to a low level, counter 204B stops updating the count value CB and clears count value CB to zero.

Address decoder 205A decodes output CA of counter 204A into an address ADD_A. Address decoder 205B decodes output CB of counter 204B into an address ADD_B.

A storage 251A includes table RWM 206A. Table RWM 206A stores a table A. Table A defines data according to count value CA. More specifically, based on count value CA, table A defines data A(xyz)b corresponding to address ADD_A output from address decoder 205A.

A storage 251B includes table RWM 206B. Table RWM 206B stores a table B. Table B defines data according to count value CB. More specifically, based on count value CB, table B defines data B(xyz)b corresponding to address ADD_B output from address decoder 205B.

On and off of PMOS transistors, which are included in variable driver 202, are controlled by the data defined in table A. Thus, the data defined in table A has the same number of bits as the number of PMOS transistors included in variable driver 202. In Embodiment 1, variable driver 202 includes three PMOS transistors, and thus the data defined in the data table A is 3-bit data.

On and off of NMOS transistors, which are included in variable driver 202, are controlled by data defined in table B. Thus, the data defined in table B has the same number of bits as the number of NMOS transistors included in variable driver 202. In Embodiment 1, variable driver 202 includes three NMOS transistors, and thus the data defined in table B is 3-bit data.

Preferably, the data defined in tables A, B gently change from a low value to a high value so that a gate current of power device 214 does not increase rapidly. Specifically, multiple data items in table A are defined so that the driving force of variable driver 202 gradually increases with an increase of count value CA. Multiple data items in table B are defined so that the driving force of variable driver 202 gradually increases with an increase of count value CB.

Table RWMs 206A, 206B may be volatile memories and written from a nonvolatile memory at power-on. Alternatively, table RWMs 206A, 206B may be nonvolatile memories.

A power module, having achieved reduced variations at initial shipping, can also be fabricated by changing data, defined in tables A, B, according to variations in characteristics of power device 214 or the transistors included in variable driver 202 at the inspection before the initial shipping. In other words, a transient increase in amount of the gate current over time since lower-arm control signal L_C has been asserted to a high level, can be changed by rewriting the tables A, B.

Latch unit 207A latches data A(xyz)b, output from table RWM 206A, based on address ADD_A which is according to count value CA, and outputs gate control signals ZA, YA, XA to variable driver 202.

Latch unit 207B latches data B(xyz)b, output from table RWM 206B, based on address ADD_B which is according to count value CB, and outputs gate control signals ZB, YB, XB to variable driver 202.

Variable driver 202 includes six CMOS (Complementary Metal-Oxide-Semiconductor) transistors connected in parallel. Variable driver 202 includes a PMOS transistor 208 and an NMOS transistor 211 which are connected between a power source VDD and a ground GND, a PMOS transistor 209 and an NMOS transistor 212 which are connected between power source VDD and ground GND, and a PMOS transistor 210 and an NMOS transistor 213 which are connected between power source VDD and ground GND.

Gates (control electrodes) of PMOS transistors 208, 209, 210 are connected to latch unit 207A and receive gate control signals ZA, YA, XA, respectively. Sources (second electrodes) of PMOS transistors 208, 209, 210 are commonly connected to power source VDD, and drains (first electrodes) of PMOS transistors 208, 209, 210 are commonly connected to a node ND1.

Gates (control electrodes) of NMOS transistors 211, 212, 213 are connected to latch unit 207B and receive gate control signals ZB, YB, XB, respectively. Sources (second electrodes) of NMOS transistors 211, 212, 213 are commonly connected to ground GND, and drains (first electrodes) of NMOS transistors 211, 212, 213 are commonly connected to node ND1.

The gate widths of PMOS transistor 210 and NMOS transistor 213 are greater than the gate widths of PMOS transistor 209 and NMOS transistor 212. The gate widths of PMOS transistor 209 and NMOS transistor 212 are greater than the gate widths of PMOS transistor 208 and NMOS transistor 211.

More preferably, the gate widths of PMOS transistor 208 and NMOS transistor 211 are W, the gate widths of PMOS transistor 209 and NMOS transistor 212 are 2W, and the gate widths of PMOS transistor 210 and NMOS transistor 213 are 4W.

This facilitates continuous changing of the gate current of power device 214, thereby allowing an overall power consumption to be reduced while suppressing surge to reduce the radiated noise.

Lower arm circuit 203 includes a gate resistor 216, a power device 214, a freewheeling diode 215, a diode 261, a resistor 262, and an NMOS transistor 263.

Gate resistor 216 has one end connected to node ND1, and the other end connected to a node ND2. Gate resistor 216 is provided to prevent rapid rise and fall of the current value of power device 214.

Power device 214 is configured of an IGBT or field effect transistor (FET), for example. Power device 214 has a gate (control electrode) connected to node ND2.

Diode 261, resistor 262, and NMOS transistor 263 are connected in series, between node ND2 and ground GND. Diode 261, resistor 262, and NMOS transistor 263 form a clamping circuit. When emergency stop is needed, NMOS transistor 263 turns on, thereby turning off the gate of power device 214.

Freewheeling diode 215 is connected in parallel with power device 214, between a first electrode and a second electrode of power device 214. If power device 214 is an IGBT, the first electrode is a collector, and the second electrode is an emitter. If power device 214 is an FET, the first electrode is a drain, and the second electrode is a source.

The second electrode (emitter or source) of a power device (not shown) included in upper arm circuit 219 and the first electrode (collector or drain) of power device 214 included in lower arm circuit 203 are commonly connected to a load 204.

The power device (not shown) included in upper arm circuit 219 and power device 214 included in lower arm circuit 203 are connected in series between VDD and ground GND, thereby forming a half bridge structure.

Next, an operation of gate driver 2 according to Embodiment 1 will be described.

In programmable decoder 202, as lower-arm control signal L_C is asserted to a high level, counter 204A starts updating the count value CA. Counter 204A increments count value CA at a rising edge of clock CLK_A. As lower-arm control signal L_C is asserted to a high level, counter 204B starts updating the count value CB. Counter 204B increments count value CB at a rising edge of clock CLK_B.

Address decoder 205A outputs address ADD_A, based on count value CA. Address decoder 205B outputs address ADD_B, based on count value CB.

Table RWM 206A outputs to latch unit 207A 3-bit data A(xyz)b corresponding to address ADD_A in table A. Table RWM 206B outputs to latch unit 207B 3-bit data B (xyz)b corresponding to address ADD_B in table B.

Latch unit 207A latches 3-bit data A(xyz)b input thereto, and outputs gate control signals XA, YA, ZA, until the next rise of clock CLK_A.

When the least significant bit z of 3-bit data A(xyz)b is 1, latch unit 207A sets gate control signal ZA, to be sent to PMOS transistor 208, to a high level. When the least significant bit z is 0, latch unit 207A sets gate control signal ZA, to be sent to PMOS transistor 208, to a low level. When the second least significant bit y of 3-bit data A(xyz)b is 1, latch unit 207A sets gate control signal YA, to be sent to PMOS transistor 209, to a high level. When the second least significant bit y is 0, latch unit 207A sets gate control signal YA, to be sent to PMOS transistor 209, to a low level. When the most significant bit x of 3-bit data A(xyz)b is 1, latch unit 207A sets gate control signal XA, to be sent to PMOS transistor 210, to a high level. When the most significant bit x is 0, latch unit 207A sets gate control signal XA, to be sent to PMOS transistor 210, to a low level.

The gate of PMOS transistor 208 turns off when gate control signal ZA input thereto is at a high level, and turns on when gate control signal ZA input thereto is at a low level. The gate of PMOS transistor 209 turns off when gate control signal YA input thereto is at a high level, and turns on when gate control signal YA input thereto is at a low level. The gate of PMOS transistor 210 turns off when gate control signal XA input thereto is at a high level, and turns on when gate control signal XA input thereto is at a low level.

PMOS transistors 208, 209, 210 convert gate control signals ZA, YA, XA into drain currents ZDA, YDA, XDA, respectively.

Latch unit 207B latches 3-bit data B(xyz)b input thereto, and outputs gate control signals XB, YB, ZB, until the next rise of clock CLK_B.

When the least significant bit z of 3-bit data B(xyz)b is 1, latch unit 207B sets gate control signal ZB, to be sent to NMOS transistor 211, to a high level. When the least significant bit z is 0, latch unit 207B sets gate control signal ZB, to be sent to NMOS transistor 211, to a low level. When the second least significant bit y of 3-bit data B(xyz)b is 1, latch unit 207B sets gate control signal YB, to be sent to NMOS transistor 212, to a high level. When the second least significant bit y is 0, latch unit 207B sets gate control signal YB, to be sent to NMOS transistor 212, to a low level. When the most significant bit x of 3-bit data B(xyz)b is 1, latch unit 207B sets gate control signal XB, to be sent to NMOS transistor 213, to a high level. When the most significant bit x is 0, latch unit 207B sets gate control signal XB, to be sent to NMOS transistor 213, to a low level.

The gate of NMOS transistor 211 turns on when gate control signal ZB input thereto is at a high level, and turns off when gate control signal ZB input thereto is at a low level. The gate of NMOS transistor 212 turns on when gate control signal YB input thereto is at a high level, and turns off when gate control signal YB input thereto is at a low level. The gate of NMOS transistor 213 turns on when gate control signal XB input thereto is at a high level, and turns off when gate control signal XB input thereto is at a low level.

NMOS transistors 211, 212, 213 convert gate control signals ZB, YB, XB into drain currents ZDB, YDB, ZDB, respectively.

Drain currents ZDA, YDA, XDA, ZDB, YDB, XDB are combined into a gate current and passed to the gate of power device 214.

Figures 2, 3, 4:
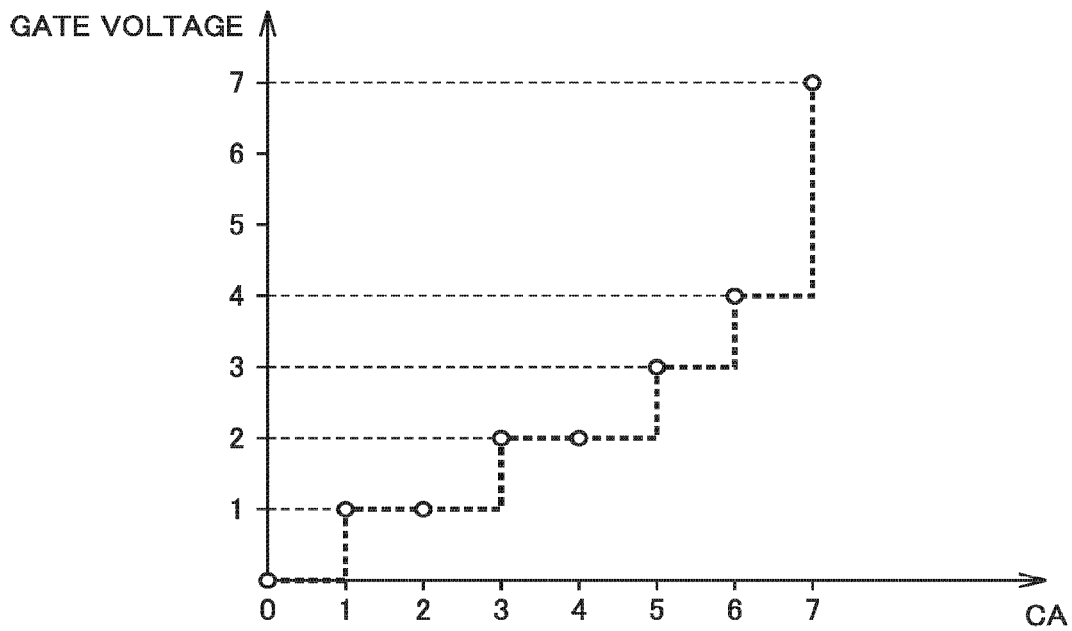
FIG. 2 is a diagram representing an example of conversion of count values CA into addresses ADD_A.
FIG. 3 is a diagram representing an example of a table A in a table RWM 206A.
FIG. 4 is a diagram representing a gate voltage of a power device 214 when the conversion of count values CA into addresses ADD_A in FIG. 2 and table A in FIG. 3 are used.

FIG. 2 is a diagram representing an example of the conversion of count values CA into addresses ADD_A. As shown in FIG. 2, address ADD_A in table A increases with an increase of count value CA.

FIG. 3 is a diagram representing an example of table A in table RWM 206A. As shown in FIG. 3, in table A, the same 3-bit data A (xyz)b is set to different addresses ADD_A that have small values. This is to gradually increase the driving force of power device 214.

Accordingly, count value CA is converted by address decoder 205A and table A into 3-bit address A(xyz)b as follows: Count values CA which are 000b, 001b, 010b, 011b, 100b, 101b, 110b, 111b are converted into 3-bit addresses A(xyz)b which are 111b, 110b, 110b, 101b, 101b, 100b, 011b, 000b, respectively.

Each bit in 3-bit data in table B stored in table RWM 206B can be inversion of each bit in 3-bit data in table A stored in table RWM 206A.

FIG. 4 is a diagram representing a gate voltage of power device 214 when the conversion of count value CA into address ADD_A in FIG. 2 and table A in FIG. 3 are used.

As shown in FIG. 4, while the gate voltage increases with an increase of count value CA, when count value CA is small immediately after lower-arm control signal L_C is asserted, an increase of the gate voltage is less than an increase of count value CA. In other words, the driving force of power device 214 gradually increases after lower-arm control signal L_C is asserted.

As shown in FIG. 4, in a first range (0≤CA≤4), the ratio of an increase in amount of driving force of variable driver 202 (i.e., an increase in amount of gate voltage), which is "2," to an increase in amount of count value CA, which is "4," is 2/4.

In a second range (4≤CA≤7), the ratio of an increase in amount of driving force of variable driver 202 (i.e., an increase in amount of gate voltage), which is "5," to an increase in amount of count value CA, which is "3," is 5/3.

The multiple data items defined in table A are defined so that the ratio of an increase in amount of driving force of variable driver 202 (i.e., an increase in amount of gate voltage) to an increase in amount of count value CA is smaller in the first range (0≤CA≤4), where count value CA is small, than in the second range (4≤CA≤7) where count value CA is large.

As described above, according to the gate driver of the present embodiment, an overall power consumption can be reduced while suppressing surge to reduce the radiated noise.

Embodiment 2

Figure 5:
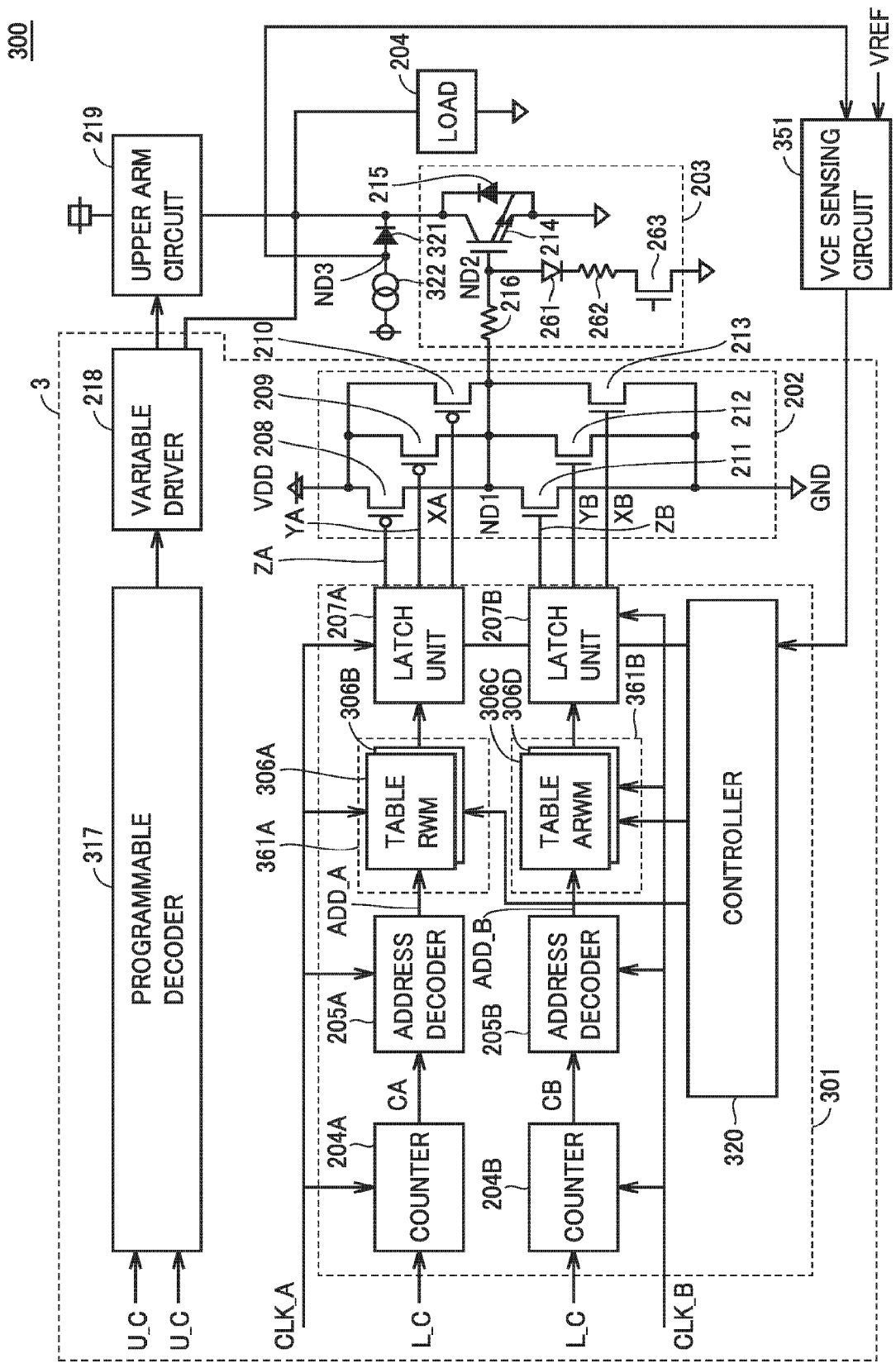
FIG. 5 is a diagram representing a configuration of a power module 300 according to Embodiment 2.

FIG. 5 is a diagram representing a configuration of a power module 300 according to Embodiment 2.

Power module 300 includes a gate driver 3, an upper arm circuit 219, and a lower arm circuit 203.

Gate driver 3 according to Embodiment 2 shown in FIG. 5 is the same as gate driver 2 according to Embodiment 1 shown in FIG. 1, except for the following:

Gate driver 3 includes a current source 322, a high-voltage diode 321, and a VCE sensing circuit 351.

Current source 322 has an input terminal connected to a power source VDD and an output terminal connected to a node ND3.

High-voltage diode 321 has an anode connected to node ND3 and a cathode connected to a collector of a power device 214.

Current flows from current source 322 via high-voltage diode 321 into the collector side of power device 214. If voltage VCE on the collector side of power device 214 is low, voltage of the output terminal of current source 322, that is, voltage of node ND3 is lower than VDD.

VCE sensing circuit 351 is configured of a constant voltage source and a comparator, for example.

VCE sensing circuit 351 compares the voltage of node ND3, connected to the output terminal of current source 322, with a reference voltage VREF (=VDD/2) to detect a magnitude of a collector-emitter voltage VCE of power device 214.

Gate driver 3 includes programmable decoders 317, 301 different from the programmable decoders according to Embodiment 1.

Programmable decoder 301 includes a storage 361A and a storage 361B which are different from the storages according to Embodiment 1. Programmable decoder 317 has the same configuration as programmable decoder 301 and thus the description thereof will be omitted.

Storage 361A includes a table RWM 306A and a table RWM 306B. Table RWM 306A stores a table A1. Table RWM 306B stores a table A2.

Tables A1, A2 define data according to count value CA. More specifically, based on count value CA, tables A1, A2 define data A(xyz)b corresponding to address ADD_A output from address decoder 205A.

Storage 361B includes a table RWM 306C and a table RWM 306D. Table RWM 306C stores a table B1. Table RWM 306D stores a table B2.

Tables B1, B2 define data according to count value CB. More specifically, based on count value CB, tables B1, B2 define data B(xyz)b corresponding to address ADD_B output from address decoder 205B.

On and off of PMOS transistors, which are included in a variable driver 202, are controlled by data defined in tables A1, A2. Thus, the data defined in tables A1, A2 each have the same number of bits as the number of PMOS transistors included in variable driver 202. In Embodiment 2, variable driver 202 includes three PMOS transistors, and thus the data defined in tables A1, A2 are each 3-bit data.

On and off of NMOS transistors, which are included in variable driver 202, are controlled by data defined in tables B1, B2. Thus, the data defined in tables B1, B2 each have the same number of bits as the number of NMOS transistors included in variable driver 202. In Embodiment 2, variable driver 202 includes three NMOS transistors, and thus the data defined in tables B1, B2 are each 3-bit data.

Preferably, the data defined in tables A1, B1 gently change from a low value to a high value so that a gate current of power device 214 does not increase rapidly. Specifically, multiple data items in tables A1, B1 are defined so that the driving force of variable driver 202 gradually increases with increases of count values CA, CB.

On the other hand, if the gate current of power device 214 needs to be increased rapidly, preferably, the gate current rapidly changes from a low value to a high value. The multiple data items in tables A2, B2 are defined so that the driving force of variable driver 202 rapidly increases with increases of count values CA, CB.

Table RWMs 306A, 306B, 306C, 306D may be volatile memories and written from a nonvolatile memory at power-on. Alternatively, table RWMs 306A, 306B, 306C, 306D may be nonvolatile memories.

A power module, having reduced variations at initial shipping, can also be fabricated by changing data, defined in tables A1, A2, B1, B2, according to variations in characteristics of power device 214 or variations in transistors included in variable driver 202 at the inspection before the initial shipping. In other words, a transient increase in amount of the gate current over time since lower-arm control signal L_C has been asserted to a high level, can be changed by rewriting the tables A1, A2, B1, B2.

Figures 6, 7:
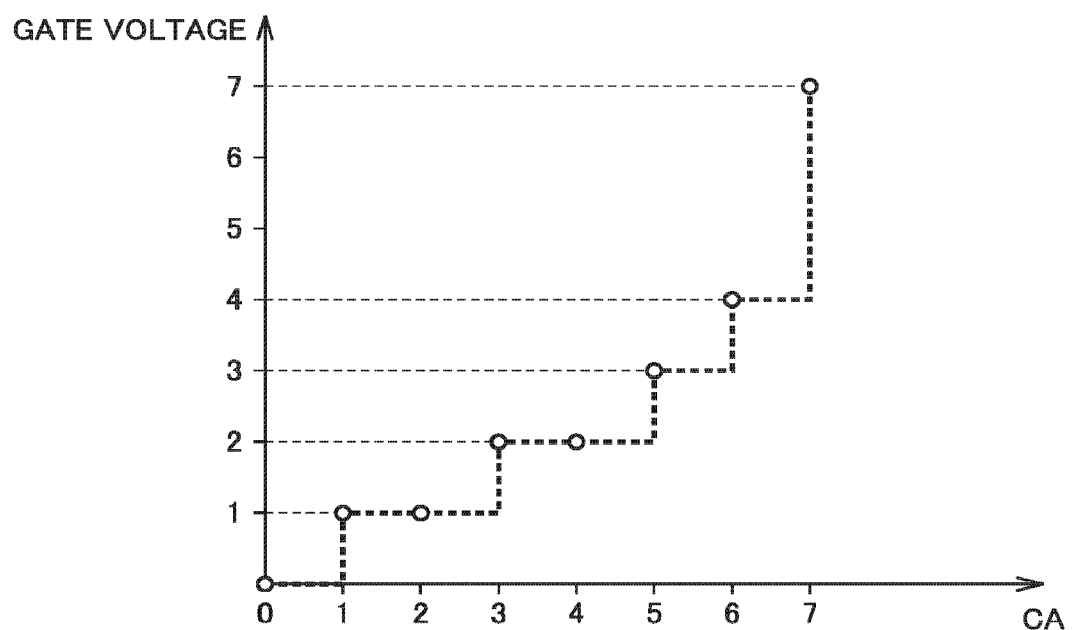
FIG. 6 is a diagram representing an example of a table A1 in a table RWM 306A.
FIG. 7 is a diagram representing a gate voltage of power device 214 when the conversion of count values CA into addresses ADD_A in FIG. 2 and table A1 in FIG. 6 are used.

FIG. 6 is a diagram representing an example of table A1 in table RWM 306A. Table A1 in FIG. 6 is the same as table A in FIG. 3. In table A1 of FIG. 6, the same 3-bit data A(xyz)b is set to different addresses ADD_A that have small values. This is to gradually increase the driving force of power device 214.

Accordingly, count value CA is converted by address decoder 205A and table A1 into 3-bit address A(xyz)b as follows: Count values CA which are 000b, 001b, 010b, 011b, 100b, 101b, 110b, 111b are converted into 3-bit addresses A(xyz)b which are 111b, 110b, 110b, 101b, 101b, 100b, 011b, 000b, respectively.

FIG. 7 is a diagram representing the gate voltage of power device 214 when the conversion of count value CA into address ADD_A in FIG. 2 and table A1 in FIG. 6 are used.

As shown in FIG. 7, while the gate voltage increases with an increase of count value CA, when count value CA is small immediately after lower-arm control signal L_C is asserted, an increase of the gate voltage is less than an increase of count value CA. In other words, the driving force of power device 214 gradually increases after lower-arm control signal L_C is asserted.

As shown in FIG. 7, in a first range (0≤CA≤4), the ratio of an increase in amount of driving force of variable driver 202 (i.e., an increase in amount of gate voltage), which is "2," to an increase in amount of count value CA, which is "4," is 2/4.

In a second range (4≤CA≤7), the ratio of an increase in amount of driving force of variable driver 202 (i.e., an increase in amount of gate voltage), which is "5," to an increase in amount of count value CA, which is "3," is 5/3.

The multiple data items defined in table A1 are defined so that the ratio of an increase in amount of driving force of variable driver 202 (i.e., an increase in amount of gate voltage) to an increase in amount of count value CA is smaller in the first range (0≤CA≤4), where count value CA is small, than in the second range (4≤CA≤7) where count value CA is large.

Figures 8, 9:
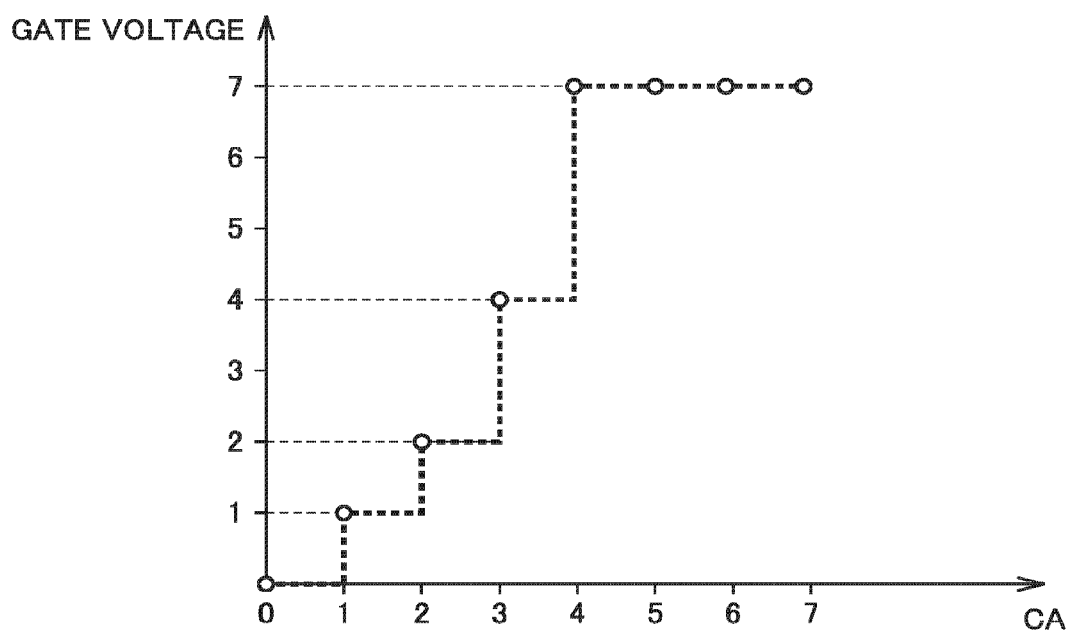
FIG. 8 is a diagram representing an example of a table A2 in a table RWM 306B.
FIG. 9 is a diagram representing a gate voltage of power device 214 when the conversion of count values CA into addresses ADD_A in FIG. 2 and table A2 in FIG. 8 are used.

FIG. 8 is a diagram representing an example of table A2 in table RWM 306B. As shown in FIG. 8, in table A2, the same 3-bit data A(xyz)b is set to different addresses ADD_A that have large values. This is to rapidly increase the driving force of power device 214.

Accordingly, count value CA is converted by address decoder 205A and table A2 into 3-bit address A(xyz)b as follows: When count value CA which are 000b, 001b, 010b, 011b, 100b, 101b, 110b, 111b are converted into 3-bit addresses A(xyz)b which are 111b, 110b, 101b, 011b, 000b, 000b, 000b, 000b, respectively.

FIG. 9 is a diagram representing a gate voltage of power device 214 when the conversion of count value CA into address ADD_A in FIG. 2 and table A2 in FIG. 8 are used.

As shown in FIG. 9, the gate voltage increases with an increase of count value CA. When count value CA is small immediately after lower-arm control signal L_C is asserted, an increase of the gate voltage is greater than an increase of count value CA. In other words, the driving force of power device 214 increases shortly after lower-arm control signal L_C is asserted.

As shown in FIG. 9, in a first range (0≤CA≤4), the ratio of an increase in amount of driving force of variable driver 202 (i.e., an increase in amount of gate voltage), which is "7," to an increase in amount of count value CA, which is "4," is 7/4.

In a second range (4≤CA≤7), the ratio of an increase in amount of driving force of variable driver 202 (i.e., an increase in amount of gate voltage), which is "0," to an increase in amount of count value CA, which is "3," is 0/3.

The multiple data items defined in table A2 are defined so that the ratio of an increase in amount of driving force of variable driver 202 (i.e., an increase in amount of gate voltage) to an increase in amount of count value CA is greater in the first range (0≤CA≤4), where count value CA is small, than in the second range (4≤CA≤7) where count value CA is large.

Immediately after lower-arm control signal L_C is asserted to a high level, a controller 320 selects either one of table A1 and table A2, according to a result of sensing by VCE sensing circuit 351.

When collector-emitter voltage VCE is less than reference voltage VREF, controller 320 selects table A2, and data according to address ADD_A in the selected table A2 is output from table RWM 306B. When collector-emitter voltage VCE is greater than or equal to reference voltage VREF, controller 320 selects table A1 and data according to address ADD_A in the selected table A1 is output from table RWM 306A.

Immediately after lower-arm control signal L_C is asserted to a high level, controller 320 selects either one of table B1 and table B2, according to a result of sensing by VCE sensing circuit 351.

When collector-emitter voltage VCE is less than reference voltage VREF, controller 320 selects table B2 and data according to address ADD_A in the selected table B2 is output from table RWM 306D. When collector-emitter voltage VCE is greater than or equal to reference voltage VREF, controller 320 selects table B1 and data according to address ADD_B in the selected table B1 is output from table RWM 306C.

As described above, according to the present embodiment, the driving force of the variable driver can be controlled by using a result of sensing of collector-emitter voltage VCE to select an appropriate table according to a status of a load 204.

Embodiment 3

Figure 10:
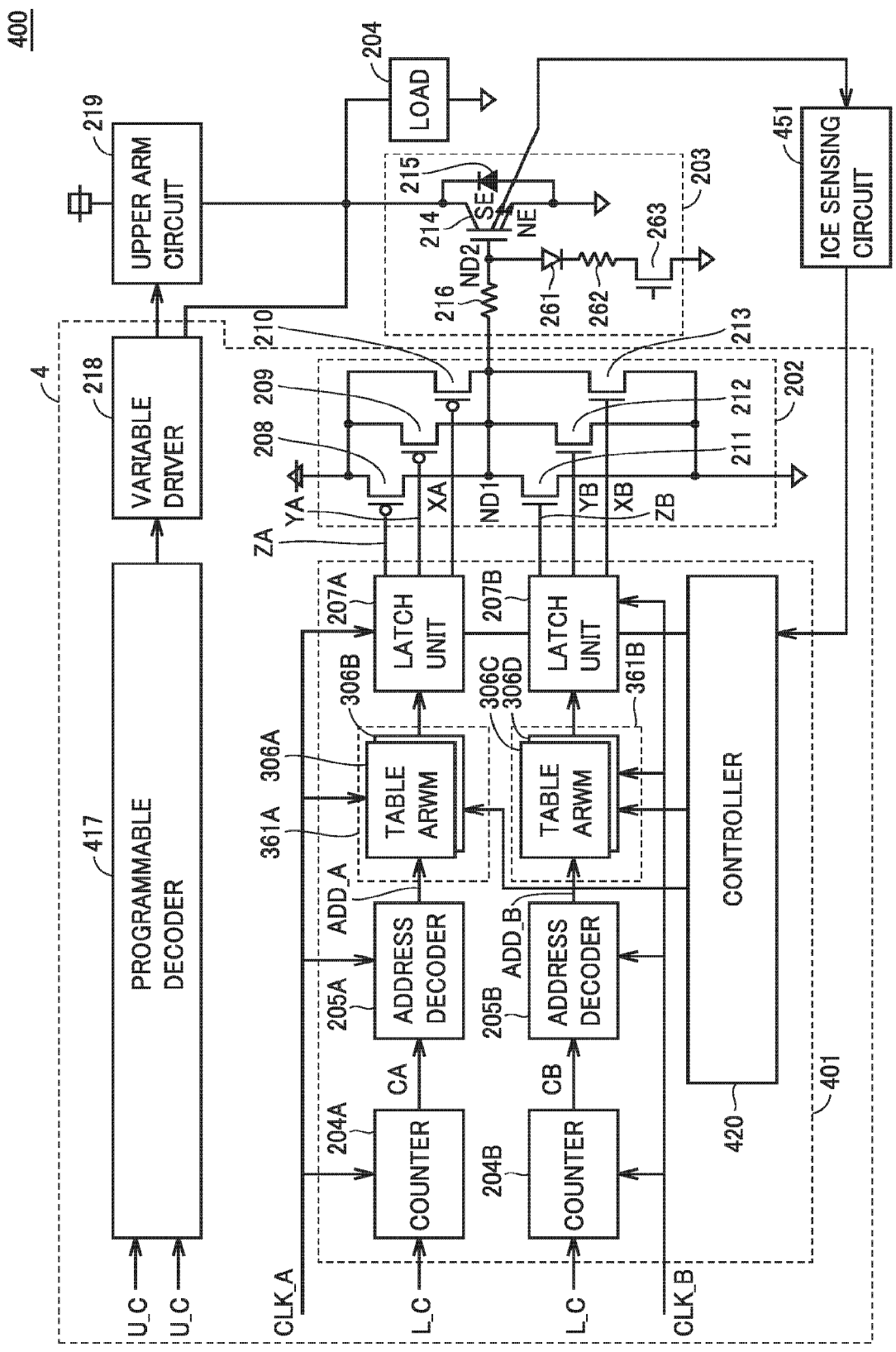
FIG. 10 is a diagram representing a configuration of a power module 400 according to Embodiment 3.

FIG. 10 is a diagram representing a configuration of a power module 400 according to Embodiment 3.

Power module 400 includes a gate driver 4, an upper arm circuit 219, and a lower arm circuit 203.

A gate driver 4 according to Embodiment 3 shown in FIG. 10 is the same as gate driver 2 according to Embodiment 1 shown in FIG. 1, except for the following:

A programmable decoder 401, as with Embodiment 2, includes a storage 361A, which includes table RWMs 306A, 306B, and a storage 361B which includes table RWMs 306C, 306D. As with Embodiment 2, table RWM 306A stores a table A1. Table RWM 306B stores a table A2. Table RWM 306C stores a table B1. Table RWM 306D stores a table B2. A programmable decoder 417 has the same configuration as programmable decoder 401 and thus the description thereof will be omitted.

If a power device 214 is an IGBT, power device 214 includes a main emitter ME and a sense emitter SE. A current, according to current flow through main emitter ME, flows through sense emitter SE. A collector-emitter current ICE flow through main emitter ME of power device 214 can be measured by measuring the current flow through sense emitter SE of power device 214.

Gate driver 4 includes an ICE sensing circuit 451.

When power device 214 is an IGBT, ICE sensing circuit 451 detects, as a sense emitter voltage, a sense emitter current which is output from sense emitter SE of the IGBT, and compares the sense emitter voltage with a reference voltage to detect whether the magnitude of the current (a collector-emitter current) ICE flow between the collector and emitter of power device 214 is greater than or equal to a reference current IREF.

Immediately after lower-arm control signal L_C is asserted to a high level, a controller 420 selects either one of table A1 and table A2, according to a result of sensing by ICE sensing circuit 451.

When collector-emitter current ICE is less than reference current IREF, controller 420 selects table A2, and data according to address ADD_A in the selected table A2 is output from table RWM 306B. When collector-emitter current ICE is greater than or equal to reference current IREF, controller 420 selects table A1, and data according to address ADD_A in the selected table A1 is output from table RWM 306A.

Immediately after lower-arm control signal L_C is asserted to a high level, controller 420 selects either one of table B1 and table B2, according to a result of sensing by ICE sensing circuit 451.

When collector-emitter current ICE is less than reference current IREF, controller 420 selects table B2, and data according to address ADD_A in the selected table B2 is output from table RWM 306D. When collector-emitter current ICE is greater than or equal to reference current IREF, controller 420 selects table B1 and data according to address ADD_B in the selected table B1 is output from table RWM 306C.

As described above, according to the present embodiment, the driving force of the variable driver can be controlled by using a result of sensing of collector-emitter current ICE to select an appropriate table according to a status of a load 204.

Embodiment 4

Figure 11:
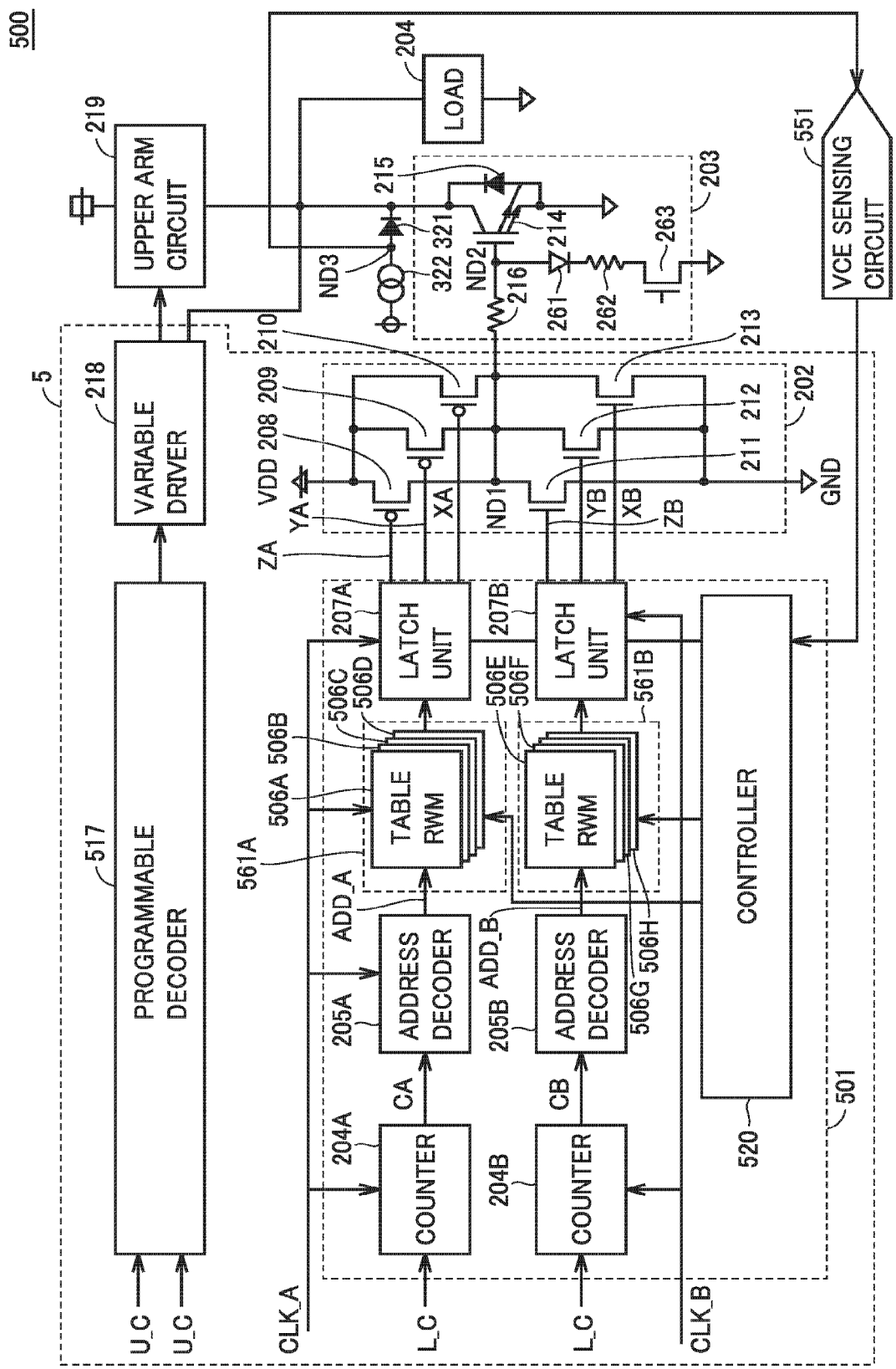
FIG. 11 is a diagram representing a configuration of a power module 500 according to Embodiment 4.

FIG. 11 is a diagram representing a configuration of a power module 500 according to Embodiment 4.

Power module 500 includes a gate driver 5, an upper arm circuit 219, and a lower arm circuit 203.

A gate driver 5 according to Embodiment 4 shown in FIG. 11 is the same as gate driver 3 according to Embodiment 2 shown in FIG. 5, except for the following:

Gate driver 5 according to the present embodiment includes a VCE sensing circuit 551, instead of VCE sensing circuit 351. VCE sensing circuit 551 includes an ADC. VCE sensing circuit 551 converts the voltage of a node ND3, which is connected to an output terminal of a current source 322, into digital data to output a digital value of a collector-emitter voltage VCE of a power device 214.

When collector-emitter voltage VCE is less than a reference voltage VREF1, VCE sensing circuit 551 outputs data D1. When collector-emitter voltage VCE is greater than or equal to reference voltage VREF1 and less than a reference voltage VREF2, VCE sensing circuit 551 outputs data D2. When collector-emitter voltage VCE is greater than or equal to reference voltage VREF2 and less than a reference voltage VREF3, VCE sensing circuit 551 outputs data D3. When collector-emitter voltage VCE is greater than or equal to reference voltage VREF3, VCE sensing circuit 551 outputs data D4.

Gate driver 5 includes programmable decoders 517, 501 different from the programmable decoders according to Embodiment 1.

Programmable decoder 501 includes a storage 561A and a storage 561B which are different from the storages according to Embodiment 1. Programmable decoder 517 has the same configuration as programmable decoder 501 and thus the description thereof will be omitted.

Storage 561A includes table RWMs 506A, 506B, 506C, 506D. Table RWM 506A stores a table A1. Table RWM 506B stores a table A2. Table RWM 506C stores a table A3. Table RWM 506D stores a table A4.

The multiple data items in tables A1, A2, A3, A4 are defined so that an increasing rate of the driving force of variable driver 202 varies with an increase of count value CA.

For multiple data items defined in table A1, the ratio of an increase in amount of driving force of variable driver 202 (i.e., an increase in amount of gate voltage) to an increase in amount of count value CA in a first range ($0 \leq CA \leq 4$), where count value CA is small, is Ra1(1), and the ratio of an increase in amount of driving force of variable driver 202 (i.e., an increase in amount of gate voltage) to an increase in amount of count value CA in a second range ($4 \leq CA \leq 7$), where count value CA, is large is Ra1(2).

For multiple data items defined in table A2, the ratio of an increase in amount of driving force of variable driver 202 (i.e., an increase in amount of gate voltage) to an increase in amount of count value CA in the first range ($0 \leq CA \leq 4$), where count value CA is small, is Ra2(1), and the ratio of an increase in amount of driving force of variable driver 202 (i.e., an increase in amount of gate voltage) to an increase in amount of count value CA in the second range ($4 \leq CA \leq 7$), where count value CA, is large is Ra2(2).

For multiple data items defined in table A3, the ratio of an increase in amount of driving force of variable driver 202 (i.e., an increase in amount of gate voltage) to an increase in amount of count value CA in the first range ($0 \leq CA \leq 4$), where count value CA is small, is Ra3(1), and the ratio of an increase in amount of driving force of variable driver 202 (i.e., an increase in amount of gate voltage) to an increase in amount of count value CA in the second range ($4 \leq CA \leq 7$), where count value CA, is large is Ra3(2).

For multiple data items defined in table A4, the ratio of an increase in amount of driving force of variable driver 202 (i.e., an increase in amount of gate voltage) to an increase in amount of count value CA in the first range ($0 \leq CA \leq 4$), where count value CA is small, is Ra4(1), and the ratio of an increase in amount of driving force of variable driver 202 (i.e., an increase in amount of gate voltage) to an increase in amount of count value CA in the second range ($4 \leq CA \leq 7$), where count value CA is large, is Ra4(2), where, Ra1(1)<Ra2(1)<Ra3(1)<Ra4(1), and Ra1(2)>Ra2(2)>Ra3(2)>Ra4(2) hold.

Storage 561B includes table RWMs 506E, 506F, 506G, 506H. Table RWM 506E stores a table B1. Table RWM 506F stores a table B2. Table RWM 506G stores a table B3. Table RWM 506H stores a table B4.

Multiple data items in tables B1, B2, B3, B4 are defined so that an increasing rate of the driving force of variable driver 202 varies with an increase of count value CB.

For multiple data items defined in table B1, the ratio of an increase in amount of driving force of variable driver 202 (i.e., an increase in amount of gate voltage) to an increase in amount of count value CB in the first range ($0 \leq CB \leq 4$), where count value CB is small, is Rb1(1), and the ratio of an increase in amount of driving force of variable driver 202 (i.e., an increase in amount of gate voltage) to an increase in amount of count value CB in the second range ($4 \leq CB \leq 7$), where count value CB is large, is Rb1(2).

For multiple data items defined in table B2, the ratio of an increase in amount of driving force of variable driver 202 (i.e., an increase in amount of gate voltage) to an increase in amount of count value CB in the first range ($0 \leq CB \leq 4$), where count value CB is small, is Rb2 (1), and the ratio of an increase in amount of driving force of variable driver 202 (i.e., an increase in amount of gate voltage) to an increase in amount of count value CB in the second range ($4 \leq CB \leq 7$), where count value CB is large, is Rb2 (2).

For multiple data items defined in table B3, the ratio of an increase in amount of driving force of variable driver 202 (i.e., an increase in amount of gate voltage) to an increase in amount of count value CB in the first range ($0 \leq CB \leq 4$), where count value CB is small, is Rb3(1), and the ratio of an increase in amount of driving force of variable driver 202 (i.e., an increase in amount of gate voltage) to an increase in amount of count value CB in the second range ($4 \leq CB \leq 7$), where count value CB is large, is Rb3(2).

For multiple data items defined in table B4, the ratio of an increase in amount of driving force of variable driver 202 (i.e., an increase in amount of gate voltage) to an increase in amount of count value CB in the first range (0≤CB≤4), where count value CB is small, is Rb4(1), and the ratio of an increase in amount of driving force of variable driver 202 (i.e., an increase in amount of gate voltage) to an increase in amount of count value CB in the second range (4≤CB≤7), where count value CB is large, is Rb4(2), where, Rb1(1)<Rb2 (1)<Rb3(1)<Rb4(1), and Rb1(2)>Rb2 (2)>Rb3(2)>Rb4(2) hold.

Immediately after lower-arm control signal L_C is asserted to a high level, a controller 520 selects any one of tables A1, A2, A3, A4, according to a result of sensing by VCE sensing circuit 551.

When collector-emitter voltage VCE is less than reference voltage VREF1, controller 520 selects table A4, and data according to address ADD_A in the selected table A4 is output from table RWM 506D. When collector-emitter voltage VCE is greater than or equal to reference voltage VREF1 and less than reference voltage VREF2, controller 520 selects table A3, and data according to address ADD_A in the selected table A3 is output from table RWM 506C. When collector-emitter voltage VCE is greater than or equal to reference voltage VREF2 and less than reference voltage VREF3, controller 520 selects table A2, and data according to address ADD_A in the selected table A2 is output from table RWM 506B. When collector-emitter voltage VCE is greater than or equal to reference voltage VREF3, controller 520 selects table A1, and data according to address ADD_A in the selected table A1 is output from table RWM 506A.

Immediately after lower-arm control signal L_C is asserted to a high level, controller 520 selects any one of tables B1, B2, B3, B4, according to a result of sensing by VCE sensing circuit 551.

When collector-emitter voltage VCE is less than reference voltage VREF1, controller 520 selects table B4 and data according to address ADD_A in the selected table B4 is output from table RWM 506H. When collector-emitter voltage VCE is greater than or equal to reference voltage VREF1 and less than reference voltage VREF2, controller 520 selects table B3 and data according to address ADD_A in the selected table B3 is output from table RWM 506G. When collector-emitter voltage VCE is greater than or equal to reference voltage VREF2 and less than reference voltage VREF3, controller 520 selects table B2 and data according to address ADD_A in the selected table B2 is output from table RWM 506F. When collector-emitter voltage VCE is greater than or equal to reference voltage VREF3, controller 520 selects table B1 and data according to address ADD_A in the selected table B1 is output from table RWM 506E.

As described above, according to the present embodiment, an appropriate table is selected from among four tables, according to collector-emitter voltage VCE, thereby flexibly suppressing surge, according to a status of a load 204.

Moreover, according to the present embodiment, the gate current, which is a combination of the gate capacitance of the IGBT in a low-voltage domain and the gate capacitance of the IGBT in a high-voltage domain, can be changed as a function of a transient time, thereby reducing an overall power consumption while suppressing surge to reduce the radiated noise.

While in the present embodiment, an appropriate table is selected from among four tables, according to collector-emitter voltage VCE, it should be noted that the present invention is not limited thereto. An appropriate table may be selected from among four tables, according to collector-emitter current ICE.

Moreover, while in the present embodiment, a table is selected from among four tables, the present invention is not limited thereto. A table may be selected from among N tables, where N is a natural number greater than or equal to 2.

Embodiment 5

Figure 12:
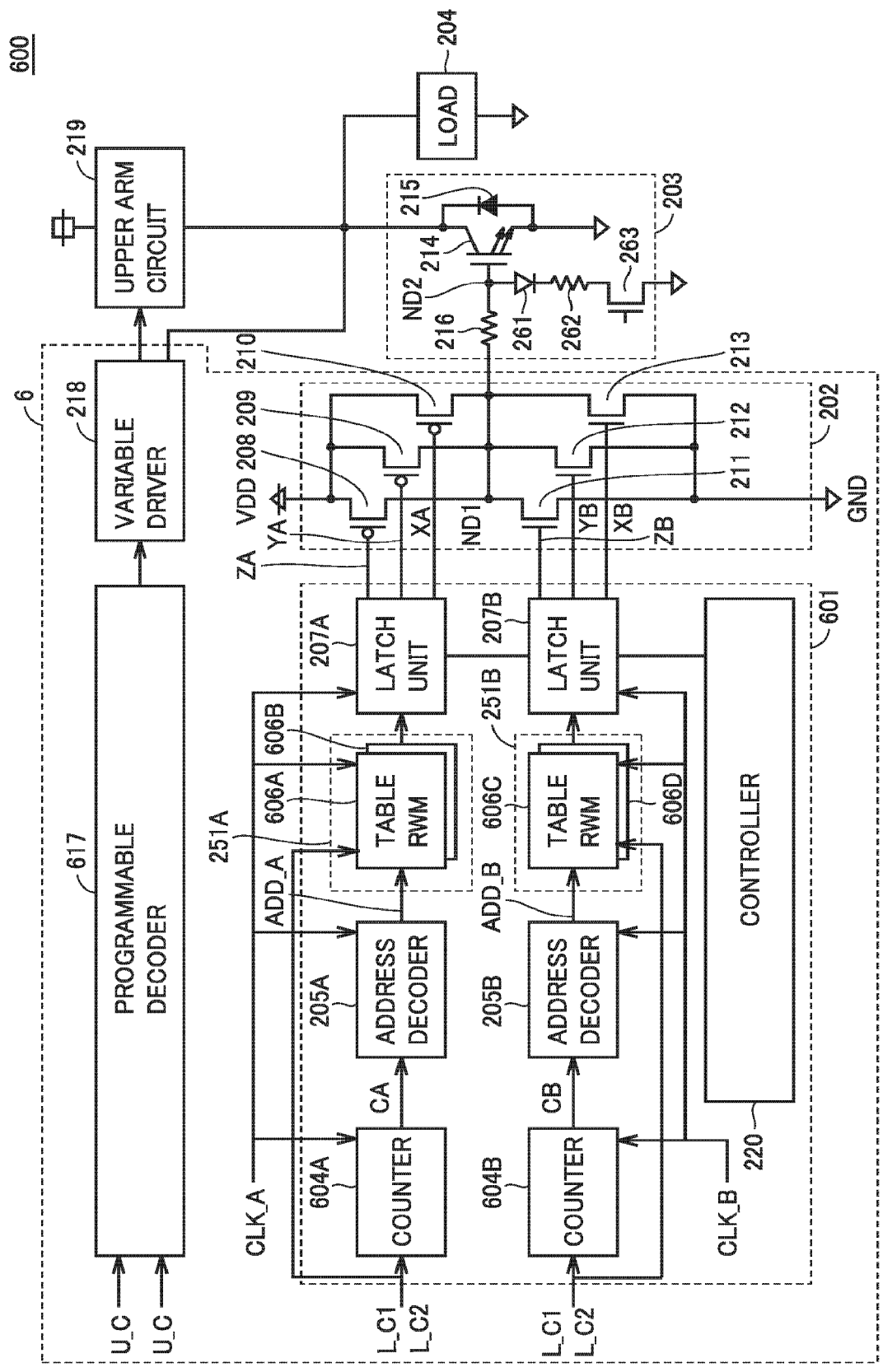
FIG. 12 is a diagram representing a configuration of a power module 600 according to Embodiment 5.

FIG. 12 is a diagram representing a configuration of a power module 600 according to Embodiment 5.

Power module 600 includes a gate driver 6, an upper arm circuit 219, and a lower arm circuit 203.

Gate driver 6 according to Embodiment 2 shown in FIG. 12 is the same as gate driver 2 according to Embodiment 1 shown in FIG. 1, except for programmable decoders 601, 617.

Programmable decoder 601 includes a storage 661A, a storage 661B, a counter 604A, and a counter 604B, which are different from those according to Embodiment 1. Programmable decoder 617 has the same configuration as programmable decoder 601 and thus the description thereof will be omitted.

In a period in which a first lower-arm control signal L_C1 is asserted to a high level, counter 604A increases a count value CA for each clock CLK. In a period in which a second lower-arm control signal L_C2 is asserted to a high level, counter 604A decreases count value CA for each clock CLK.

In the period in which first lower-arm control signal L_C1 is asserted to a high level, counter 604B increases a count value CB for each clock CLK. In the period in which second lower-arm control signal L_C2 is asserted to a high level, counter 604B decreases count value CB for each clock CLK.

Storage 661A includes a table RWM 606A and a table RWM 606B. Table RWM 606A stores a table A1. Table RWM 606B stores a table A2. Table RWMs 606A, 606B, 606C, 606D may be volatile memories and written from a nonvolatile memory at power-on. Alternatively, table RWMs 606A, 606B, 606C, 606D may be nonvolatile memories.

Tables A1, A2 define data according to count value CA. More specifically, based on count value CA, table A1 defines data A(xyz)b corresponding to address ADD_A output from address decoder 205A. Based on count value CA, table A2 defines data B(xyz)b corresponding to address ADD_A output from address decoder 205A.

In the period in which first lower-arm control signal L_C1 is asserted to a high level, table RWM 606A outputs data A(xyz) corresponding to address ADD_A in table A1.

In the period in which second lower-arm control signal L_C2 is asserted to a high level, table RWM 606B outputs data B(xyz) corresponding to address ADD_A in table A2.

On and off of PMOS transistors, which are included in variable driver 202, are controlled by data defined in tables A1, A2. Thus, the data defined in tables A1, A2 each have the same number of bits as the number of PMOS transistors included in variable driver 202. In Embodiment 5, variable driver 202 includes three PMOS transistors, and thus the data defined in tables A1, A2 are each 3-bit data.

Storage 661B stores a table RWM 606C, and a table RWM 606D. Table RWM 606C stores a table B1. Table RWM 606D stores a table B2.

Tables B1, B2 define data according to count value CB. More specifically, based on count value CB, table B1 defines data C(xyz)b corresponding to address ADD_B output from address decoder 205B. Based on count value CB, table B2 defines data D(xyz)b corresponding to address ADD_B output from address decoder 205B.

In the period in which first lower-arm control signal L_C1 is asserted to a high level, table RWM 606C outputs data C(xyz) corresponding to address ADD_B in table B1.

In the period in which second lower-arm control signal L_C2 is asserted to a high level, table RWM 606D outputs data D(xyz) corresponding to address ADD_B in table B2.

On and off of NMOS transistors, which are included in variable driver 202, are controlled by the data defined in tables B1, B2. Thus, the data defined in tables B1, B2 each have the same number of bits as the number of NMOS transistors included in variable driver 202. In Embodiment 5, variable driver 202 includes three NMOS transistors, and thus the data defined in tables B1, B2 are each 3-bit data.

Preferably, the data defined in tables A1, B1 gently change from a low value to a high value so that a gate current of power device 214 does not increase rapidly. Specifically, multiple data items in tables A1, B1 are defined so that the driving force of variable driver 202 gradually increases with increases of count values CA, CB.

FIG. 13 is a diagram representing an example of table A1 in table RWM 606A. Table A1 in FIG. 13 is the same as table A in FIG. 3. In table A1 of FIG. 13, the same 3-bit data A(xyz)b is set to different addresses ADD_A that have small values. This is to gradually increase the driving force of power device 214.

Count value CA is converted by address decoder 205A and table A1 into 3-bit data A(xyz)b as follows: As count value CA increases from 000b to 001b, 010b, 011b, 100b, 101b, 110b, and 111b, 3-bit data A(xyz)b changes from 111b to 110b, 110b, 101b, 101b, 100b, 011b, and 000b, respectively.

FIG. 14 is a diagram representing an example of table B1 in table RWM 606C. In table B1 of FIG. 14, the same 3-bit data B(xyz)b is set to different addresses ADD_B that have small values. This is to gradually increase the driving force of power device 214.

Count value CB is converted by address decoder 205B and table B1 into 3-bit data C(xyz)b as follows: As count value CB increases from 000b to 001b, 010b, 011b, 100b, 101b, 110b, and 111b, 3-bit data C(xyz)b changes from 000b to 001b, 001b, 010b, 010b, 011b, 100b, and 111b, respectively.

The multiple data items in table B2 are defined so that the driving force of variable driver 202 decreases with a decrease of count value CB.

The multiple data items in table A2 are defined so that the driving force of variable driver 202 decreases with a decrease of count value CA, other than a decrease of count value CA from a first value to a second value, and the driving force of variable driver 202 increases with the decrease of count value CA from the first value to the second value.

FIG. 15 is a diagram representing an example of table A2 in table RWM 606B. Count value CA is converted by address decoder 205A and table A2 into 3-bit data C(xyz)b as follows: As count value CA decreases from 111b to 110b, 101b, 100b, 011b, 010b, 001b, and 000b, 3-bit data B(xyz)b changes from 000b to 011b, 100b, 100b, 100b, 110b, 100b, and 111b, respectively. As data C(xyz)b changes from 110b to 100b with a decrease of count value CA from 010b to 001b, the driving force of variable driver 202 increases.

Figures 16, 17:
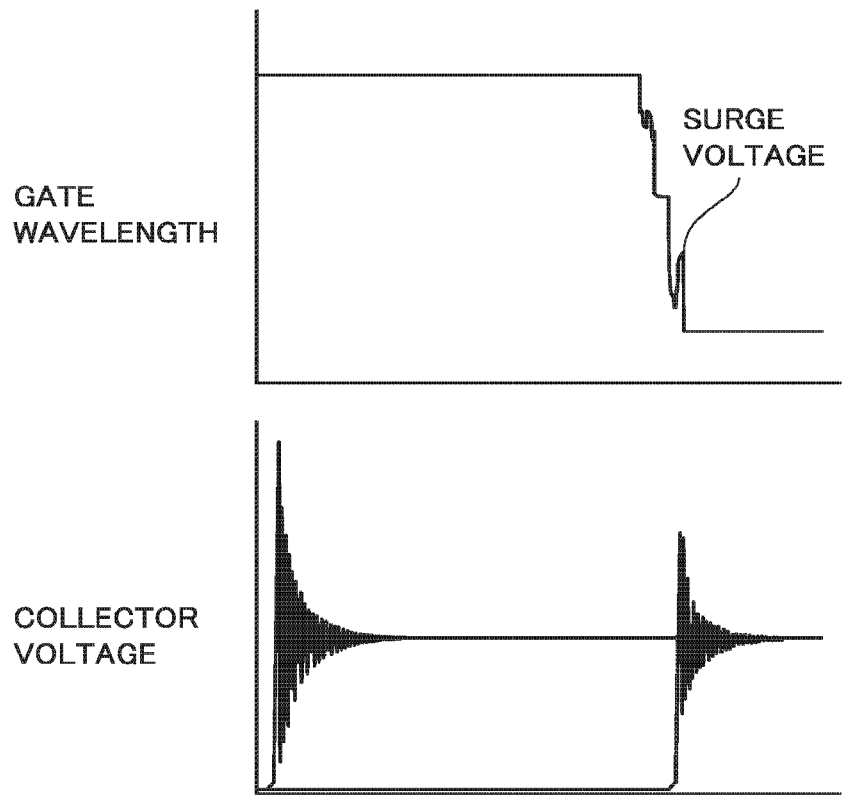
FIG. 16 is a diagram representing an example of a table B2 in a table RWM
FIG. 17 is a diagram representing a result of simulation of reducing a counter value CA and a counter value CB.

FIG. 16 is a diagram representing an example of table B2 in table RWM 606D. Count value CB is converted by address decoder 205B and table B2 into 3-bit data D(xyz)b as follows: As count value CB decreases from 111b to 110b, 101b, 100b, 011b, 010b, 001b, and 000b, 3-bit data D(xyz)b changes from 111b to 111b, 111b, 111b, 100b, 100b, 010b, and 000b, respectively.

In FIG. 15, while counter value CA is 111b to 010b, the value of data B(xyz)b increases with a decrease of counter value CA, which reduces the driving force of variable driver 202. As counter value CA decreases to 001b, the value of data B(xyx)b temporarily decreases, thereby temporarily increasing the driving force of variable driver 202. This is to reduce surge of a collector voltage.

FIG. 17 is a diagram representing a result of simulation of reducing counter value CA and counter value CB.

In FIG. 17, the collector voltage on the right side of the figure represents a voltage VCE on the collector side of power device 214 when table A2 of FIG. 15 is used.

The collector voltage on the left side of the figure represents voltage VCE on the collector side of power device 214 when "110b" is used for B(xyz)b for ADD_A "0001b+OFFSET" in the table of FIG. 15, instead of "100b." Surge of the collector voltage is observed on the left side of the figure.

The collector voltage on the right side of the figure represents voltage VCE on the collector side of power device 214 when table A2 of FIG. 15 and table B2 of FIG. 16 are used.

The gate voltage slightly increases at a moment table A2 outputs 100b for ADD_A "0001b+OFFSET" and table B2 outputs 010b for ADD_B "0001b+OFFSET." As a result, the collector voltage surges less on the right side of the figure.

Variations

The present invention is not limited to the above embodiments. For example, the present invention also includes variations as follows:

(1) The Number of MOS Transistors Included In Variable Driver

The variable driver includes N PMOS transistors which are a first to N-th PMOS transistors, and N NMOS transistors which are a first to N-th NMOS transistors.

The gate width of an i-th (i≥2) PMOS transistor is greater than the gate width of a (i−1)th PMOS transistor. The gate width of an i-th (i≥2) NMOS transistor is greater than the gate width of a (i−1)th NMOS transistor.

Preferably, the gate width of the i-th (i≥2) PMOS transistor may be $2^{(i-1)}$ times the gate width of the first PMOS transistor, and the gate width of the i-th (i≥2) NMOS transistor may be $2^{(i-1)}$ times the gate width of the first NMOS transistor.

Alternatively, the gate width of the i-th (i≥2) PMOS transistor may be K×(i−1) times the gate width of the first PMOS transistor, and the gate width of the i-th (i≥2) NMOS transistor may be K×(i−1) times the gate width of the first NMOS transistor, where K is a number greater than 1.

Table WRM 206A outputs N-bit data defined in table A. The latch unit outputs a gate control signal which controls on and off of the i-th PMOS transistor according to a value of an i-th bit in N-bit data output from table WRM 206A.

Table WRM 206B outputs N-bit data defined in table B. The latch unit outputs a gate control signal which controls on and off of the i-th NMOS transistor according to a value of an i-th bit in N-bit data output from table WRM 206B.

(2) Control of Variable Driver

While in the present invention, three PMOS transistors and three NMOS transistors included in the variable driver are controlled according to the count values, the present invention is not limited thereto.

The three PMOS transistors included in the variable driver may be set to on once a lower-arm control signal is activated, and the three NMOS transistors included in the variable driver may be controlled according to the count values. Alternatively, the three NMOS transistors included in the variable driver may be set to on once a lower-arm control signal is activated, and the three PMOS transistors included in the variable driver may be controlled according to the count values.

(3) Control of MOS Transistors

The variable driver includes multiple PMOS transistors and multiple NMOS transistors. Table A may be defined so that the number of PMOS transistors to be set to on, among the multiple PMOS transistors, increases with an increase of count value CA. Table B may be defined so that the number of NMOS transistors to be set to on, among the multiple NMOS transistors, increases with an increase of count value CB.

For example, in the case where PMOS transistors 208, 209, 210 have the same gate width, when table A outputs "0," "1," "2," and "3," PMOS transistors 208, 209, 210 may turn off, PMOS transistor 208 may turn on, PMOS transistors 208, 209 may turn on, and PMOS transistors 208, 209, 210 may turn on, respectively.

In the case where NMOS transistors 211, 212, 213 have the same gate width, when table B outputs "0," "1," "2," and "3," NMOS transistors 211, 212, 213 may turn off, NMOS transistor 211 may turn on, NMOS transistors 211, 212 may turn on, and NMOS transistors 211, 212, 213 may turn on, respectively.

(4) Monitoring of Collector-Emitter Voltage VCE and Collector-Emitter Current ICE Combining Embodiments 2 and 3, surge can be suppressed flexibly, depending on the status of load 204, by monitoring collector-emitter voltage VCE and a collector-emitter current ICE and changing the tables. In other words, collector-emitter current ICE and collector-emitter voltage VCE of an IGBT change according to when load 204, such as a motor, is rotating or when a vehicle is braking. The driving force of the gate driver of the IGBT can be changed by changing the tables according to collector-emitter current ICE and collector-emitter voltage VCE of the IGBT.

(5) Tables A2, B2 according to Embodiment 5

In the above embodiments, multiple data items in table B2 are defined so that the driving force of variable driver 202 decreases with a decrease of count value CB; and the multiple data items in table A2 are defined so that the driving force of variable driver 202 decreases with a decrease of count value CA, other than a decrease of count value CA from a first value to a second value, and the driving force of variable driver 202 increases with the decrease of count value CA from the first value to the second value. However, the present invention is not limited thereto.

The multiple data items in table A2 may be defined so that the driving force of variable driver 202 decreases with a decrease of count value CA; and the multiple data items in table B2 may be defined so that the driving force of variable driver 202 decreases with a decrease of count value CB, other than a decrease of count value CB from a first value to a second value, and the driving force of variable driver 202 increases with the decrease of count value CB from the first value to the second value.

Alternatively, tables A2, B2 as below may be used.

Multiple data items in table A2 is defined so that the driving force of variable driver 202 decreases with a decrease of count value CA, other than the decrease of count value CA from the first value to the second value, and the driving force of variable driver 202 increases with the decrease of count value CA from the first value to the second value; and multiple data items in table B2 are defined so that the driving force of variable driver 202 decreases with a decrease of count value CB, other than the decrease of count value CB from the first value to the second value, and the driving force of variable driver 202 increases with the decrease of count value CB from the first value to the second value.

The presently disclosed embodiments should be considered in all aspects illustrative and not restrictive. The scope of the present invention is indicated by the appended claims, rather than by the description above, and all changes that come within the scope of the claims and the meaning and range of equivalency of the claims are intended to be embraced within their scope.

REFERENCE SIGNS LIST 2, 3, 4, 5 gate driver; 200, 300, 400, 500, 600 power module; 201, 217, 301, 317, 401, 417, 501, 517, 601, 617 programmable decoder; 202, 218 variable driver; 203 lower arm circuit; 204A, 204B, 604A, 604B counter; 205A, 205B address decoder; 206A, 206B, 306A, 306B, 306C, 306D, 506A, 506B, 506C, 506D, 506E, 506F, 506G, 506H, 606A, 606B, 606C, 606D table RWM; 207A, 207B latch unit; 208, 209, 210 PMOS transistor; 211, 212, 213, 263 NMOS transistor; 214 power device; 215 freewheeling diode; 216 gate resistor; 219 upper arm circuit; 220, 320, 420, 520 controller; 251A, 251B, 361A, 361B, 561A, 561B storage; 261 diode; 262 resistor; 321 high-voltage diode; 322 current source; 351 VCE sensing circuit; and 451, 551 ICE sensing circuit.

The invention claimed is:

1. A gate driver for driving an arm circuit which includes a power device, the gate driver comprising:
   a programmable decoder;
   a variable driver for driving the arm circuit,
   the programmable decoder including:
     a counter whose count value increases for each clock;
     an address decoder for converting the count value into an address;
     a storage storing at least one table defining data corresponding to the address converted from the count value; and
     a latch unit for latching the data according to the address in the table output from the storage,
   the variable driver including a plurality of MOS transistors;
   the latch unit having outputs connected to control electrodes of the plurality of MOS transistors, the plurality of MOS transistors having first electrodes which are commonly connected a control electrode of the power device, the plurality of MOS transistors having second electrodes which are commonly connected to a power source,
   a plurality of data items in the table being defined in the table so that a driving force of the variable driver increases with an increase of the count value,
   the counter being configured to update the count value while an arm control signal is being activated.

2. The gate driver according to claim 1, wherein
   the plurality of data items defined in the table are defined so that a ratio of an increase in amount of the driving force of the variable driver to an increase in amount of the count value is smaller in a first range than in a second range, the first range being a range where the count value is small, the second range being a range where the count value is large.

3. The gate driver according to claim 1, wherein the plurality of data items defined in the table are defined so that a ratio of an increase in amount of the driving force of the variable driver to an increase in amount of the count value is greater in a first range than in a second range, the first range being a range where the count value is small, the second range being a range where the count value is large.

4. The gate driver according to claim 1, wherein the variable driver includes N MOS transistors consisting of a first MOS transistor to an Nth MOS transistor, an i-th MOS transistor has a gate width greater than a gate width of an (i−1)-th MOS transistor, where i≥2, the storage outputs N-bit data defined in the table, and the latch unit outputs an i-th gate control signal for controlling on and off of the i-th MOS transistor, according to a value of an i-bit in the N-bit data output from the storage.

5. The gate driver according to claim 4, wherein the gate width of the i-th MOS transistor is $2^{(i-1)}$ times a gate width of the first MOS transistor.

6. The gate driver according to claim 4, wherein the gate width of the i-th MOS transistor is K×(i−1) times a gate width of the first MOS transistor, where K is a number greater than 1.

7. The gate driver according to claim 1, wherein the table is defined so that a total number of MOS transistors that turn on, among the plurality of MOS transistors, increases with an increase of the count value.

8. The gate driver according to claim 1, wherein the storage stores a plurality of the tables, the power device includes the control electrode, a first electrode, and a second electrode, the gate driver, further comprising:
a voltage sensing circuit for detecting a voltage between the first electrode and the second electrode of the power device; and
a controller for selecting a table from among the plurality of tables, according to a magnitude of the detected voltage, wherein
the storage outputs the data corresponding to the address from the address decoder in the selected table.

9. The gate driver according to claim 8, wherein the plurality of tables comprises a first table and a second table, and
the controller selects one of the first table and the second table, according to the magnitude of the detected voltage.

10. The gate driver according to claim 9, wherein the first table defines a plurality of data items, the plurality of data items being defined in the first table so that a ratio of an increase in amount of the driving force of the variable driver to an increase in amount of the count value is smaller in a first range than in a second range, the first range being a range where the count value is small, the second range being a range where the count value is large,
the second table defines a plurality of data items, the plurality of data items being defined in the second table so that the ratio of the increase in amount of the driving force of the variable driver to the increase in amount of the count value is greater in the first range than in the second range, and
the controller selects the first table when the detected voltage is greater than or equal to a reference voltage, and selects the second table when the detected voltage is less than the reference voltage.

11. The gate driver according to claim 8, further comprising
a constant current source; and
a diode having a cathode connected to the first electrode of the power device, wherein
an output of the constant current source and an anode terminal of the diode are connected to a node, and
the voltage sensing circuit detects the voltage between the first electrode and the second electrode of the power device by detecting a voltage of the node.

12. The gate driver according to claim 1, wherein the storage stores a plurality of the tables,
the power device includes the control electrode, a first electrode, and a second electrode,
the gate driver, further comprising:
a current sensing circuit for detecting a current flow between the first electrode and the second electrode of the power device; and
a controller for selecting a table from among the plurality of tables, according to a magnitude of the detected current, wherein
the storage outputs the data corresponding to the address from the address decoder in the selected table.

13. The gate driver according to claim 12, wherein the plurality of tables comprises a first table and a second table, and
the controller selects one of the first table and the second table, according to the magnitude of the detected current.

14. The gate driver according to claim 13, wherein the first table defines a plurality of data items, the plurality of data items being defined in the first table so that a ratio of an increase in amount of the driving force of the variable driver to an increase in amount of the count value is smaller in a first range than in a second range, the first range being a range where the count value is small, the second range being a range where the count value is large,
the second table defines a plurality of data items, the plurality of data items being defined in the second table so that the ratio of the increase in amount of the driving force of the variable driver to the increase in amount of the count value is greater in the first range than in the second range, and
the controller selects the first table when the detected current is greater than or equal to a reference current, and selects the second table when the detected current is less than the reference current.

15. The gate driver according to claim 12, wherein the power device is an insulated gate bipolar transistor which includes a sense emitter, and
the current sensing circuit detects the current flow between the first electrode and the second electrode of the power device by detecting a current flow through the sense emitter.

16. A gate driver for driving an arm circuit which includes a power device, the gate driver comprising:
a programmable decoder; and
a variable driver for driving the arm circuit,
the programmable decoder including:
a first counter for increasing a first count value for each first clock;

a first storage storing a first table defining data according to the first count value;
a first latch unit for latching the data according to the first count value in the first table output from the first storage;
a second counter for increasing a second count value for each second clock;
a second storage storing a second table defining data according to the second count value; and
a second latch unit for latching the data according to the second count value in the second table output from the second storage,
the variable driver including a plurality of PMOS transistors and a plurality of NMOS transistors,
the first latch unit having outputs connected to control electrodes of the plurality of PMOS transistors, the plurality of PMOS transistors having first electrodes commonly connected to a control electrode of the power device, the plurality of PMOS transistors having second electrodes commonly connected to a first power source,
the second latch unit having an output connected to control electrodes of the plurality of NMOS transistors, the plurality of NMOS transistors having first electrodes commonly connected to the control electrode of the power device, the plurality of NMOS transistors having second electrodes commonly connected to a second power source,
the first table defining a plurality of data items, the plurality of data items in the first table being defined so that a driving force of the variable driver increases with an increase of the first count value, the second table defining a plurality of data items, the plurality of data items in the second table being defined so that the driving force of the variable driver increases with an increase of the second count value.

17. A gate driver for driving an arm circuit which includes a power device, the gate driver comprising:
a programmable decoder; and
a variable driver for driving the arm circuit,
the programmable decoder including:
a counter for increasing a count value for each clock while a first arm control signal is being activated, and decreasing the count value for each clock while a second arm control signal is being activated;
an address decoder for converting the count value into an address;
a storage storing a first table and a second table which define data according to the address converted from the count value,
the storage being configured to output the data according to the address in the first table while the first arm control signal is being activated, and output the data according to the address in the second table while the second arm control signal is being activated; and
a latch unit for latching the data output from the storage,
the variable driver including: a plurality of MOS transistors,
the latch unit having outputs connected to control electrodes of the plurality of MOS transistors, the plurality of MOS transistors having first electrodes commonly connected to a control electrode of the power device, the plurality of MOS transistors having second electrodes commonly connected to a power source,
a plurality of data items in the first table changes a driving force of the variable driver with an increase of the count value, a plurality of data items in the second table changes the driving force of the variable driver with a decrease of the count value.

18. The gate driver according to claim 17, wherein
the plurality of data items in the first table causes the driving force of the variable driver to increase with the increase of the count value,
the plurality of data items in the second table causes the driving force of the variable driver to decrease with the decrease of the count value, other than a decrease of the count value from a first value to a second value, and causes the driving force of the variable driver to increase with the decrease of the count value from the first value to the second value.

19. A power module, comprising:
an upper arm circuit which includes a first power device;
a lower arm circuit which includes a second power device;
a first gate driver for driving the upper arm circuit; and
a second gate driver for driving the lower arm circuit,
the first gate driver and the second gate driver each being the gate driver according to claim 1,
the first power device included in the upper arm circuit and the second power device included in the lower arm circuit being connected in series, between a first power source and a second power source.

* * * * *